(12) United States Patent
Suzuki et al.

(10) Patent No.: US 9,153,524 B2
(45) Date of Patent: Oct. 6, 2015

(54) METHOD OF FORMING STACKED-LAYER WIRING, STACKED-LAYER WIRING, AND ELECTRONIC ELEMENT

(71) Applicants: Koei Suzuki, Kanagawa (JP); Takanori Tano, Chiba (JP); Hiroshi Miura, Miyagi (JP); Atsushi Onodera, Kanagawa (JP)

(72) Inventors: Koei Suzuki, Kanagawa (JP); Takanori Tano, Chiba (JP); Hiroshi Miura, Miyagi (JP); Atsushi Onodera, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/320,836

(22) Filed: Jul. 1, 2014

(65) Prior Publication Data

US 2015/0008589 A1    Jan. 8, 2015

(30) Foreign Application Priority Data

Jul. 5, 2013    (JP) ................................. 2013-141566

(51) Int. Cl.
*H01L 23/48*    (2006.01)
*H01L 21/768*   (2006.01)

(52) U.S. Cl.
CPC ........ *H01L 23/481* (2013.01); *H01L 21/76802* (2013.01); *H01L 21/76804* (2013.01); *H01L 21/76837* (2013.01); *H01L 21/76843* (2013.01)

(58) Field of Classification Search
CPC ............ H01L 21/768; H01L 21/76802; H01L 21/76804; H01L 21/76805; H01L 21/76807; H01L 21/76825; H01L 21/76837; H01L 21/76843; H01L 21/76849; H01L 21/76894; H01L 21/76877
See application file for complete search history.

(56) References Cited

U.S. PATENT DOCUMENTS

| | | |
|---|---|---|
| 5,448,113 A | 9/1995 | Suzuki et al. |
| 8,877,584 B2 * | 11/2014 | Suzuki et al. ................. 438/257 |
| 2004/0238816 A1 | 12/2004 | Tano et al. |
| 2007/0096088 A1 | 5/2007 | Tano et al. |
| 2008/0029766 A1 | 2/2008 | Onodera et al. |
| 2009/0261320 A1 | 10/2009 | Tano et al. |
| 2009/0278138 A1 | 11/2009 | Suzuki et al. |
| 2010/0072463 A1 | 3/2010 | Tano et al. |

(Continued)

FOREIGN PATENT DOCUMENTS

| | | |
|---|---|---|
| JP | 2003-518755 | 6/2003 |
| JP | 2005-310962 | 11/2005 |

(Continued)

OTHER PUBLICATIONS

U.S. Appl. No. 08/027,985, filed Mar. 8, 1993.

*Primary Examiner* — Thanhha Pham
(74) *Attorney, Agent, or Firm* — Cooper & Dunham LLP

(57) ABSTRACT

A method of forming a stacked-layer wiring includes forming first wettability variable layer on a substrate using material that changes surface energy by energy application; forming first conductive layer in or on the first wettability variable layer; forming second wettability variable layer on the first wettability variable layer using material that changes surface energy by energy application; forming concave portion to become wiring pattern of second conductive layer to the second wettability variable layer while concurrently forming high surface energy area on surface exposed by forming the concave portion by changing surface energy; forming via hole by exposing a part of the first conductive layer while concurrently forming high surface energy area on surface exposed by forming the via hole by changing surface energy; and applying conductive ink to the high surface energy area to form the second conductive layer and via simultaneously.

7 Claims, 5 Drawing Sheets

(56) References Cited

U.S. PATENT DOCUMENTS

| | | |
|---|---|---|
| 2010/0181571 A1 | 7/2010 | Tano et al. |
| 2010/0184936 A1 | 7/2010 | Tano et al. |
| 2010/0297456 A1 | 11/2010 | Tano et al. |
| 2010/0308321 A1 | 12/2010 | Tano et al. |
| 2011/0215336 A1 | 9/2011 | Onodera et al. |
| 2011/0266549 A1 | 11/2011 | Onodera et al. |
| 2012/0312583 A1 | 12/2012 | Suzuki et al. |
| 2012/0315498 A1 | 12/2012 | Tano et al. |

FOREIGN PATENT DOCUMENTS

| | | |
|---|---|---|
| JP | 2006-163418 | 6/2006 |
| JP | 2009-105413 | 5/2009 |
| JP | 2009-188259 | 8/2009 |
| JP | 2013-016773 | 1/2013 |
| WO | WO01/47044 A2 | 6/2001 |

* cited by examiner

METHOD OF FORMING STACKED-LAYER WIRING, STACKED-LAYER WIRING, AND ELECTRONIC ELEMENT

This application claims priority pursuant to 35 U.S.C. §119 to Japanese Patent Application No. 2013-141566 filed on Jul. 5, 2013 in the Japan Patent Office, the disclosures of which are incorporated by reference herein in their entirety.

BACKGROUND

1. Technical Field

The present invention relates to a method of forming a stacked-layer wiring, a stacked-layer wiring, and an electronic element.

2. Background Art

Wirings and electrodes used for semiconductor elements and electronic circuits can be formed by using a photolithographic technique. The photolithographic technique employs an exposure apparatus having high precision processing such as a stepper, and a vacuum apparatus for forming layers, and etching. The photolithographic technique requires expensive equipment, and further the number of processes becomes greater and the process becomes complex, and further material use efficiency becomes low, with which manufacturing cost increases.

Manufacturing cost can be reduced by using a printed electronics technology. As to the printed electronics technology, functional ink or paste such as fine metal particles is printed on a substrate base directly to form conductive patterns, and various printing methods can be used for the printed electronics technology.

For example, a patterning method using an inkjet method (or liquid droplet discharge method) can be used for the printed electronics technology. Specifically, liquid such as ink dispersed with fine particles is applied on a substrate base directly using an inkjet method, and then a curing process using heat processing and a laser irradiation process is conducted to form a conductive layer or film. This method can simplify the process and can enhance material use efficiency. Further, this method does not require material for patterning such as a photoresist used for the photolithographic technique, with which manufacturing cost can be reduced.

However, as to conventional inkjet methods, liquid droplets discharged on the substrate base may spread after the impact onto the substrate base, with which fine patterns are difficult to form on the substrate base. Further, conventional inkjet methods are difficult to respond to a demand of enhanced density and enhanced function device, and a demand of enhanced density wirings/electrodes and enhanced fine patterns for the device. Further, as to the inkjet method, when electrodes are stacked, a position of lower layer electrodes and a position of upper layer electrodes need to be aligned with high precision.

SUMMARY

In one aspect of the present invention, a method of forming a stacked-layer wiring is devised. The method includes forming a first wettability variable layer on a substrate using material that changes surface energy by energy application; forming a first conductive layer in the first wettability variable layer or on the first wettability variable layer; forming a second wettability variable layer on the first wettability variable layer formed with the first conductive layer using material that changes surface energy by energy application; forming a concave portion to become a wiring pattern of a second conductive layer to the second wettability variable layer by employing a laser ablation method using a laser having a wavelength of ultraviolet range while concurrently forming a high surface energy area on a surface of the second wettability variable layer exposed by forming the concave portion by changing surface energy; forming a via hole by exposing a part of the first conductive layer by employing the laser ablation method using the laser having the wavelength of ultraviolet range while concurrently forming a high surface energy area on a surface of the second wettability variable layer exposed by forming the via hole by changing surface energy; and applying conductive ink to the high surface energy area to form the second conductive layer and a via simultaneously.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

Figure 1:
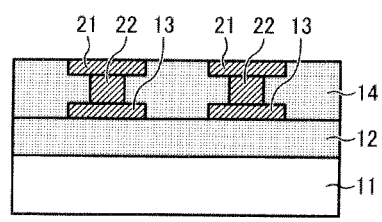
FIG. 1 is a schematic cross-sectional view of one example of a stacked-layer wiring according to an example embodiment.

The accompanying drawings are intended to depict exemplary embodiments of the present invention and should not be interpreted to limit the scope thereof. The accompanying drawings are not to be considered as drawn to scale unless explicitly noted, and identical or similar reference numerals designate identical or similar components throughout the several views.

DETAILED DESCRIPTION

A description is now given of exemplary embodiments of the present invention. It should be noted that although such terms as first, second, etc. may be used herein to describe various elements, components, regions, layers and/or sections, it should be understood that such elements, components, regions, layers and/or sections are not limited thereby because such terms are relative, that is, used only to distinguish one element, component, region, layer or section from another region, layer or section. Thus, for example, a first element, component, region, layer or section discussed below could be termed a second element, component, region, layer or section without departing from the teachings of the present invention.

In addition, it should be noted that the terminology used herein is for the purpose of describing particular embodiments only and is not intended to be limiting of the present invention. Thus, for example, as used herein, the singular forms "a", "an" and "the" are intended to include the plural forms as well, unless the context clearly indicates otherwise. Moreover, the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Furthermore, although in describing views shown in the drawings, specific terminology is employed for the sake of clarity, the present disclosure is not limited to the specific terminology so selected and it is to be understood that each specific element includes all technical equivalents that have a similar function, operate in a similar manner, and achieve a similar result.

Referring now to the drawings, a method of forming stacked-layer wiring, stacked-layer wiring, and electronic element are described hereinafter.

(Method of Forming Stacked-Layer Wiring, Stacked-Layer Wiring)

FIG. 1 is schematic cross-sectional view of a stacked-layer wiring according to an example embodiment, and FIG. 2 shows steps of a method forming a stacked-layer wiring according to an example embodiment. The stacked-layer wiring illustrated in FIG. 1 includes a base 11, a first wettability variable layer 12 formed on the base 11, a second wettability variable layer 14, which can be used as an inter-layer insulation layer 14, a first conductive layer 13 (first conductive layer pattern), a second conductive layer 21 (second conductive layer pattern), a via 22 that electrically connects the first conductive layer 13 and the second conductive layer 21, and the stacked-layer wiring can be formed with a process illustrated in FIGS. 2(A) to 2(G). The wettability variable layer can be also referred to as wettability changing layer.

Figure 2A:
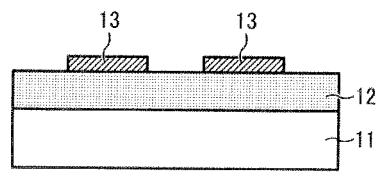
FIGS. 2A, 2B, 2C, 2D, 2E, 2F and 2G are a schematic view of a method of forming tacked-layer wiring according to an example embodiment.
Figure 2B:
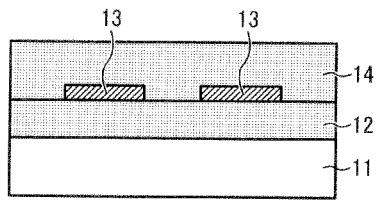
Figure 2C:
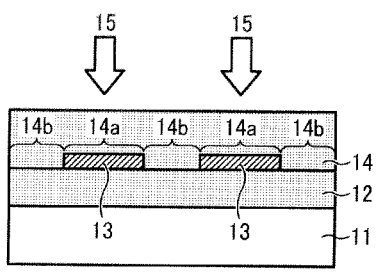
Figure 2D:
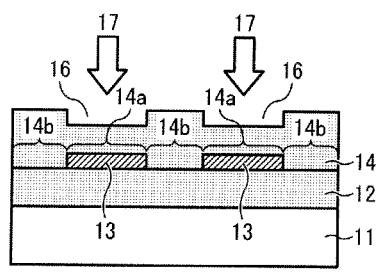
Figure 2E:
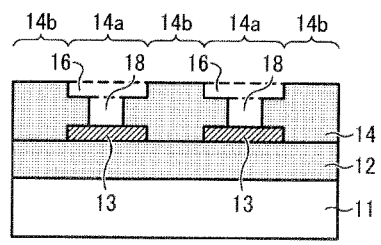
Figure 2F:
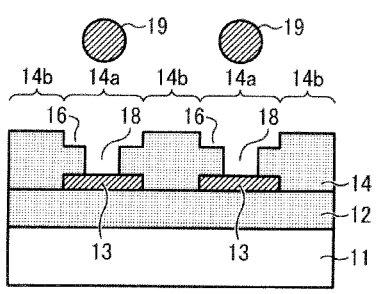
Figure 2G:
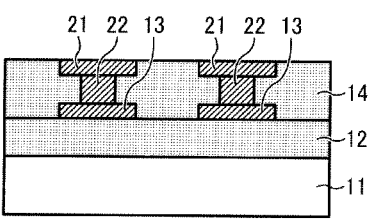

The method of forming the stacked-layer wiring includes the steps of forming the first wettability variable layer 12, using material that can change its surface energy when energy is applied, on the base 11; forming the first conductive layer 13 (FIG. 2A); forming the second wettability variable layer 14, using material that can change its surface energy when energy is applied, on the first conductive layer 13 (FIG. 2B); forming a concave portion 16, which is to become a wiring pattern of the second conductive layer, on the second wettability variable layer 14 employing a laser ablation method using a laser having a wavelength of ultraviolet range (laser 15) and forming a via hole 18 to expose a part of the first conductive layer 13, and forming a high surface energy area 14a by changing surface energy of the surface of the exposed second wettability variable layer (FIGS. 2C to 2E); applying conductive ink 19 to the high surface energy area 14a (FIG. 2F); and simultaneously forming the second conductive layer 21 and a via 22 (FIG. 2G).

In a case of FIGS. 1 and 2, the first wettability variable layer 12 using material that can change its surface energy when energy is applied is formed on the base 11, and the first conductive layer 13 is formed on the first wettability variable layer 12. The first conductive layer 13 is formed, for example, by forming a high surface energy area on the first wettability variable layer 12 by irradiating a laser having a wavelength of ultraviolet range and then applying conductive ink on the above mentioned high surface energy area. However, the first conductive layer 13 can be formed using other printing methods, vacuum film forming method, photolithography, and etching process. The first conductive layer 13 can be formed using known methods.

The second wettability variable layer 14 using material that can change its surface energy when energy is applied is formed on the first conductive layer 13. The second wettability variable layer 14 can function as an inter-layer insulation layer (insulation layer between wirings) to maintain electrical insulation with the first conductive layer 13. A via 22 used for electrical connection between wirings, and a second conductive layer 21 are formed in the second wettability variable layer 14.

The second conductive layer 21 and the via 22 can be formed as follows. At first, the concave portion 16, which becomes a wiring pattern of the second conductive layer 21, is formed on the second wettability variable layer 14 employing a laser ablation method using a laser having a wavelength of ultraviolet range, and a via hole 18 is formed to expose a part of the first conductive layer 13, in which the high surface energy area 14a is formed by changing surface energy of the exposed surface of the second wettability variable layer 14. Then, conductive ink 19 is applied to the high surface energy area 14a. The applied conductive ink 19 can be cured by heat-baking, with which the second conductive layer 21 and the via 22 can be formed simultaneously.

A description is given of each member. Material of the base 11 is not limited to a specific material as long as wiring, electronic element, electronic element array, and display element can be formed. For example, a glass plate and a film can be used as a base. The film base may be polyimide (PI) base, polyether sulfone (PES) base, polyethylene terephthalate (PET) base, polycarbonate (PC) base, polyethylene naphthalate (PEN) base, polyetherimide (PEI) base, and polyacrylate (PAR) base or the like.

The first wettability variable layer 12 and the second wettability variable layer 14 use material that can change its surface energy (or free surface energy, critical surface tension) by applying energy such as heat, ultraviolet ray, electronic beam, plasma or the like. The material that can change its surface energy by applying energy is preferably used. Material that can change its surface energy (critical surface tension) greatly before and after applying energy is preferably used because energy applied portion (i.e., lyophilic portion) and energy not-applied portion (i.e., lyophobic portion) can be contrasted clearly.

As illustrated in FIGS. 2(C) to 2(F), the high surface energy area 14a having a greater critical surface tension, and the low surface energy area 14b having a smaller critical surface tension can be formed in the second wettability variable layer 14. The high surface energy area 14a can be formed by selectively applying energy to the second wettability variable layer 14. When the first conductive layer 13 is viewed from a direction perpendicular to a main face of the base 11 (e.g., surface), a shape of the first conductive layer 13 and a shape of the high surface energy area 14a are the same.

In the above processing, a portion of the second wettability variable layer 14 applied with energy becomes the high surface energy area 14a but not limited hereto. For example, if a portion of the second wettability variable layer 14 applied with energy can be changed to low surface energy area, such material can be also used.

Material that can change surface energy (critical surface tension) is preferably polymer material, and polymer material having a hydrophobic group at a side chain is preferable. The hydrophobic group at the side chain is not limited to a specific group, in which functional groups having a terminating group of —$CF_2CH_3$, —$CF_2CF_3$, —$CF(CF_3)_2$, —$CFH_2$ can be used. As to the hydrophobic group, alkyl group, fluoro alkyl group, alkyl group having multi-branched structure, fluoro alkyl group, or isotopes of these are preferable. The hydrophobic group at the side chain includes C=O (carbonyl group) which can be decomposed by applying energy. Structure including C=O is, for example, a functional group (i.e., light-sensitive functional group) having —CO—, —COO—, —COO—, —CONH—, —NHCOO—, —NHOCO—, or isotopes of these. The hydrophobic group is preferably connected to a main chain via a functional group having C=O.

When a light-sensitive functional group such as —CO—, —COO—, —COO—, —CONH—, —NHCOO—, and —NHOCO— is cut by ultraviolet ray irradiation, the side chain reacts with moisture in the atmosphere, and forms a hydrophilic group such as carboxyl group (—COOH), hydroxy group (—OH), or the like. Therefore, a surface of a portion of a wettability variable layer having received the ultraviolet ray irradiation becomes hydrophilicity (or high surface energy). If the side chain has a multi-branched structure, critical surface tension of the wettability variable layer can be changed greatly by applying smaller energy.

Further, the main chain of polymer material is not limited specific material. For example, the main chain of polymer material is preferably no absorption of ultraviolet ray, or lesser absorption of ultraviolet ray. The main chain of polymer material preferably has a structure that molecular structure of the main chain is not cut by ultraviolet ray, or has a structure that molecular structure of the main chain is difficult to cut by ultraviolet ray. This feature is preferable because if the bonding of main chain is cut by ultraviolet ray irradiation (i.e., energy application), insulation performance of polymer material deteriorates, with which stability and reliability of polymer material deteriorates.

The main chain having the above feature is, for example, a structure that can be obtained by polymerization of polyimide, polyimide-imide, (meta) acrylic acid, in which the main chain including polyimide is preferable in view of insulation performance. Polyimide has a rigid structure and good level of filling performance. Therefore, even if molecular chain is cut by applying energy, the polyimide structure can maintain a certain level of insulation performance. Therefore, when polyimide is used for the main chain, wiring having higher insulation reliability can be formed. Further, when polyimide is used, higher insulation performance can be maintained although having absorbency or hygroscopicity of about 2%, with which water resistance can be good enough while maintaining higher insulation performance.

As to the polyimide, thermoset polyimide that can be formed by a dehydration reaction of polyamic acid (polyamide acid) by heating, and polyimide soluble to solvent are known, and both types of polyimide can be used. The soluble polyimide can be obtained by applying an application liquid solved in solvent and then vaporizing the solvent at low temperature such as less than 200 Celsius degrees. Further, the thermoset polyimide is required to be heated at temperature that can cause a dehydration reaction, which means polyimide is required to be heated 200 Celsius degrees or more. In view such properties of polyimide, any types of polyimide can be selected in view of heat resistance performance of the base 11 and other conditions.

As above described, material that can change its surface energy when energy is applied includes a main chain, and a side chain that can form a hydrophilic group by ultraviolet ray irradiation, and preferably the main chain includes polyimides. For example, when the film base requiring low temperature process is used, and when surface energy is changed using a smaller level of ultraviolet ray irradiation for higher throughput process, for example, known soluble polyimide can be used, in which soluble polyimide having a main chain and a side chain having a multi-branched structure can be used preferably.

By forming a wettability variable layer using the above described material, a low surface energy area 14b, which is an area that the via 22 and the second conductive layer 21 are not formed can be set with water-repellent property. With this configuration, even if the conductive ink 19 is applied while some of the conductive ink 19 overspills from the concave portion 16, the conductive ink 19 is less likely to adhere to the low surface energy area 14b, and the conductive ink 19 flows into the concave portion 16 and the via hole 18, with which residue of ink may not occur. Especially, as to the forming of via, the concave portion 16 can be used as a guide to flow the conductive ink 19 to the via hole 18. Therefore, compared to a usual dropping method, the conductive ink can be filled preferably. In the above described process, the concave portion 16 and the via hole 18 can be formed while the surface of the concave portion 16 and the via hole 18 can be changed to the high surface energy area 14a, in which a physical shape effect such as a concave portion and an effect of reducing free energy of a system to a minimum level can be obtained by one process, with which the conductive ink 19 can be filled in the concave portion 16 and the via hole 18 easily.

The thickness of wettability variable layer 14 is not limited specifically. The thickness of wettability variable layer 14 can be set depending on a depth of to-be-formed wiring, required insulation performance, depth of the via 22, and a configuration of wettability variable layer such as single layer or stacked layer.

A method of forming the concave portion 16 and the via hole 18 is described with reference to FIG. 2. The concave portion 16 and the via hole 18 can be formed using a patterning method such as photolithography and etching, or a laser ablation. In an example embodiment, the concave portion 16 and the via hole 18 is formed using a printing process that can reduce the number of process steps to reduce the number of process steps. Specifically, a laser ablation method using a laser having a wavelength of ultraviolet range is employed so that the concave portion 16 and the via hole 18 can be formed simultaneously while changing the surface energy of a wettability variable layer.

The method using the laser having a wavelength of ultraviolet range can suppress decrease of insulation performance of wettability variable layer, and can conduct an exposure in the atmosphere, which means productivity can be higher, which is preferable.

The conductive ink can be applied to the formed concave portion 16 and via hole 18 using a printing method such as an inkjet method and a nozzle printing method, which do not use a mask or a print plate. The printing method such as an inkjet method and a nozzle printing method used as an application method can be preferably combined with a direct printing method such as a laser ablation method not using ask.

As to the laser ablation method, a laser beam or a stage is scanned, with which a line shape such as the concave portion 16 and also a hole shape such as the via hole 18 can be processed. For example, after processing the concave portion 16 using CAD data, the via hole 18 can be processed using the CAD data, in which the concave portion 16 and the via hole 18 can be processed continuously, with which alignment processing can be simplified.

By processing the concave portion 16 and the via hole 18 using the laser ablation method, an upper part of a processed face of the concave portion 16 can be shaped into a taper shape having a broader area, with which ink can be flowed easily. Further, the concave portion 16 having a line shape and the via hole 18 having a hole shape can be processed as a combined shape, with which yield rate of the concave portion 16 and the via hole 18 can be preferable compared to forming the via hole 18 alone.

Further, a width of the concave portion 16 affects to a width of the second conductive layer 21, processing fluctuation when forming the concave portion 16 affects resistance fluctuation of the second conductive layer 21, and the hole diameter fluctuation of the via hole 18 affects resistance fluctuation of the via 22. Therefore, a Laser ablation method that can conduct the process smoothly and has higher processing precision is desired.

When a laser having a wavelength of ultraviolet range is used, processing that can process fine patterns with less fluctuation can be conducted, and a fine-finished face can be obtained. Further, by selecting wavelength of laser depending on types of weltability variable layer, the concave portion 16 and the via hole 18 can be formed with fine pattern and higher size precision, and a good level of surface energy change can be devised.

The laser having a wavelength of ultraviolet range is, for example, a yttrium aluminum garnet (YAG) laser such as third harmonic wave (wavelength: 355 nm), fourth harmonic wave (wavelength: 266 nm), and fifth harmonic wave (wavelength: 215 nm), and an excimer laser such as XeF (wavelength: 351 nm), XeCl (wavelength: 308 nm), KrF (wavelength: 248 nm), ArF (wavelength: 193 nm), which can be used preferably. To reduce an effect of laser output and an effect to process and environment due to ozone generation in the atmosphere, third harmonic wave (wavelength: 355 nm) or fourth harmonic wave (wavelength: 266 nm) of YAG laser, or the excimer laser are preferably used. Further, when the excimer laser is used, the excimer laser is preferably any one of XeF (wavelength: 351 nm), XeCl (wavelength: 308 nm), and KrF (wavelength: 248 nm).

The concave portion 16 and the via hole 18 can be formed employing a laser ablation method using a laser having a wavelength of ultraviolet range. For example, in one method, a laser beam is scanned to form fine patterns, and in another method, a base (or work) having a process target such as the wettability variable layer 14 is scanned to form fine patterns. The method of scanning the laser beam or the work does not require a mask, with which the process can be lower cost, and further, an increase of the number of process steps can be suppressed while forming a complex pattern at a high speed. Further, laser can be selectively irradiated to a target area based on CAD data. A method of scanning a laser beam using a galvano scanner is preferably used.

A description is given of the first conductive layer 13, the second conductive layer 21, and the via 22. The first conductive layer 13, the second conductive layer 21, and the via 22 can be obtained by applying conductive ink and then heating the conductive ink using an oven, a hot plate, light, or curing the conductive ink using ultraviolet ray irradiation. As described above, in an example embodiment, the second conductive layer 21 and the via 22 can be formed by applying the conductive ink in the same applying step.

Conductive ink is not limited any specific one. The conductive ink having conductivity after curing can be selected and used. For example, conductive material solved in solvent, fine particle of conductive material dispersed in solvent, and precursor of conductive material or its precursor solved in solvent can be used.

The conductive material is, for example, silver (Ag), gold (Au), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), aluminum (Al), an alloy composed of two or more these metals, halide silver of these metals, and copper oxide. Further, the conductive material may be nano carbon materials such as carbon nano tube and graphene dispersed in organic solvent or water, aqueous solution of conductive polymer prepared by doping polystyrene sulfonate (PSS) to doped PANI (polyaniline), and polyethylenedioxythiophene (PEDOT). Preferably, silver, copper, carbon nano tube having lower resistance are used. Surface of these fine particles are preferably coated with organic material or conductive material to enhance material dispersion and anti-oxidation.

The conductive ink can be applied on a high surface energy area formed on a surface of a wettability variable layer using various printing methods such as a spin coating method, a dip coating method, a screen printing method, an offset printing method, a flexo printing method, a gravure printing method, a micro contact method, an inkjet method, a nozzle printing method, and an aerosol jet method. When forming the second conductive layer 21 and the via 22, the concave portion 16 and the via hole 18 are applied with the conductive ink simultaneously using preferably an inkjet method or a nozzle printing method because the conductive ink having viscosity or surface tension suitable to flow the conductive ink into the concave portion 16 in line with the surface energy of the wettability variable layer 14 can be applied, and smaller liquid droplet can be supplied to form relatively fine patterns.

Compared to other methods such as the spin coating method, material use efficiency of the inkjet method and nozzle printing method can be greater, and the inkjet method and nozzle printing are a non-contact printing method not using a mask, with which a larger area can be formed easily, which is preferable.

As described above, by combining the formation of the wettability variable layer and the laser ablation method, the formation of the concave portion 16 and the via hole 18 and changing the exposed surface of the concave portion 16 and the via hole 18 to hydrophilicity can be conducted simultaneously. Further, by using the inkjet method or the nozzle printing method as an application method of conductive ink, a non-contact processing without using a mask can be devised. With this configuration, wiring-to-wiring connection can be conducted with enhanced line patterns with a smaller number of process steps and function enhanced stacked-layer wiring can be formed with less fluctuation of resistance.

Figure 3:
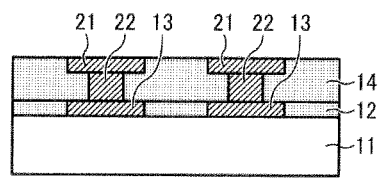
FIG. 3 is a schematic cross-sectional view of another example of a stacked-layer wiring according to an example embodiment.

Further, as illustrated in FIG. 3, the first conductive layer 13 can be formed in the first wettability variable layer 12 by employing a laser ablation method. Specifically, a concave portion which becomes a wiring pattern of the first conductive layer 13 can be formed in the first wettability variable layer 12 employing a laser ablation method using a laser having a wavelength of ultraviolet range, and surface energy of a surface of the first wettability variable layer 12, exposed by forming the concave portion, can be changed to form a high surface energy area, and the conductive ink is applied to the high surface energy area to form the first conductive layer 13. Further, by stacking the second wettability variable layer 14 and repeating the process of forming the second conductive layer 21 and the via 22, multi-layered wirings can be formed.

(Manufacturing Method of Electronic Element, Electronic Element)

An electronic element can be manufactured by forming stacked-layer wiring using a method of forming stacked-layer wiring according to an example embodiment and then forming a semiconductor layer on the formed stacked-layer wiring. The manufacturing method of the electronic element can manufacture the electronic element with a smaller number of process steps. Further, the manufacturing method of the electronic element according to an example embodiment can be used to manufacture a function enhanced electronic element that electrically connects a switching transistor and a driving transistor by a via.

When the electronic element thin film transistor, a first conductive layer and a second conductive layer formed by using a forming method of stacked-layer wiring can be used as an electrode such as any one of a gate electrode and a source/drain electrode. In this case, absorbency of hulk material is little, and withstand voltage failure at stacked interlayers may not occur. Therefore, as described above, polymer material having polyimide in a main chain is preferably used as a wettability variable layer.

A description is given of processes of the manufacturing method of an electronic element. At first, a gate electrode (first electrode) is formed on a base by printing, and a wettability variable layer is formed on the gate electrode, in which the wettability variable layer uses material that can change its surface energy (critical surface tension) when energy is applied, and the wettability variable layer also has a function of a gate insulation layer. Then, a concave portion is formed in the wettability variable layer by employing a laser ablation method using laser having a wavelength of ultraviolet range, in which a concave portion has a shape corresponding to a source/drain electrode and wiring composing an electronic element.

Then, a via hole is formed by employing the laser ablation method using laser having a wavelength of ultraviolet range. The via hole is formed to form a via that connects a source electrode of a switching transistor and a gate electrode of a driving transistor. Then, as same as the above described method of forming the stacked-layer wiring, a concave portion and a via hole are formed in the wettability variable layer, and surface energy of exposed surface is changed to form a high surface energy area. Then, conductive ink is applied to the high surface energy area, with which the source/drain electrode of the switching transistor, the source/drain electrode of the driving transistor, and the wiring and the via can be formed simultaneously.

Figure 5:
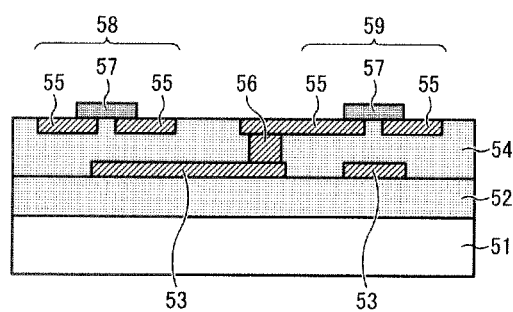
FIG. 5 is a schematic cross-sectional view of one example of an electronic element according to an example embodiment.
Figure 6:
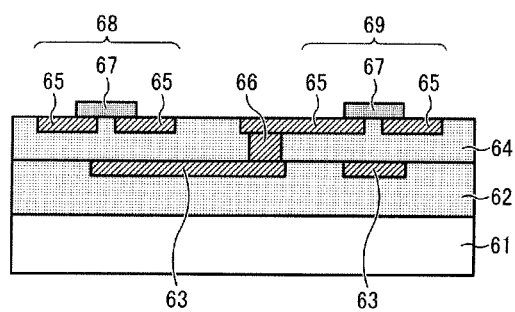
FIG. 6 is a schematic cross-sectional view of another example of an electronic element according to an example embodiment.

FIGS. 5 and 6 are schematic cross-sectional views of example electronic elements according to an example embodiment. An electronic element illustrated in FIG. 5 is a thin film transistor having a switching transistor 59 and a driving transistor 58. The electronic element illustrated in FIG. 5 includes, for example, a base 51, a wettability variable layer 52, a wettability variable layer 54 used as an insulation layer or film, a first conductive layer 53 used as a gate electrode, a second conductive layer 55 used as a source electrode and a drain electrode, a via 56 that electrically connects the first conductive layer 53 and the second conductive layer 55 as a stacked-layer wiring, and a semiconductor layer 57. The gate electrode 53 (first conductive layer 53) is formed on a surface of the wettability variable layer 52.

An electronic element illustrated in FIG. 6 is a thin film transistor having a switching transistor 69 and a driving transistor 68. The electronic element illustrated in FIG. 6 includes, for example, a base 61, a wettability variable layer 62, a wettability variable layer 64 used as an insulation layer or film, a first conductive layer 63 used as a gate electrode, a second conductive layer 65 used as a source electrode and a drain electrode, a via 66 that electrically connects the first conductive layer 63 and the second conductive layer 65 as a stacked-layer wiring, and a semiconductor layer 67. The gate electrode 63 (first conductive layer 63) is formed in the wettability variable Layer 62 by employing the laser ablation method.

A description is given of examples conducted by using the above described method. It should be noted that the present invention is not limited to the following examples.

Example 1

A stacked-layer wiring was formed using the process illustrated in FIGS. 2(A) to 2(G). At first, as illustrated in FIG. 2A, the first wettability variable layer 12 was formed on the base 11 (e.g., glass plate) cleaned by wet cleaning, wherein the first wettability variable layer 12 uses material that can change its surface energy by energy application. The material used for the first wettability variable layer 12 was N-methylpyrrolidone (NMP) solution of thermoset polyimide having a hydrophobic group on a side chain. The thermoset polyimide NMP solution was applied using a spin coating method to form the first wettability variable layer 12 having a layer thickness of 150 nm. At this stage, the surface of the first wettability variable layer 12 was at low surface energy due to the polyimide having the hydrophobic side chain.

Then, a photo mask having an opening patter same as the wiring pattern of the first conductive layer 13 was placed on the first wettability variable layer 12, and ultraviolet ray (emitted from a super high pressure mercury lamp) having a wavelength of 300 nm or less was irradiated to the first wettability variable layer 12 over the photo mask, in which the ultraviolet ray irradiation level was 2 J/cm$^2$. At this stage, a concave portion was not formed on the first wettability variable layer 12, but a high surface energy area (i.e., area irradiated by ultraviolet ray) and a low surface energy area (i.e., area not irradiated by ultraviolet ray ultraviolet ray) were formed on a substantially flat face.

Then, conductive ink (e.g., nano metal ink) including Ag particles having particle diameter of about 30 nm dispersed in aqueous solvent was selectively applied on the high surface energy area (i.e., area irradiated by ultraviolet ray) using an inkjet method. Because aqueous solution dispersing fine metal particles was used, the conductive ink can be spread along the high surface energy area (i.e. area irradiated by ultraviolet ray), and a fine pattern can be formed for any liquid droplet size used for the inkjet method.

Then, the material was pre-baked in an oven of 100 Celsius degrees in the atmosphere, and was post-baked for one hour in the oven of 180 Celsius degrees in the atmosphere, with which the first conductive layer 13 having a layer thickness of 130 nm was formed (FIG. 2A).

Then, the second wettability variable layer 14 was formed. The material of the second wettability variable layer 14 was polyimide NMP solution, which was prepared by mixing soluble polyimide material A having a dendrimer side chain illustrated as the following chemical formula (1) and polyimide (product name: CT4112, KYOCERA Chemical Corporation) having insulation performance higher than the soluble polyimide material A and not having a side chain.

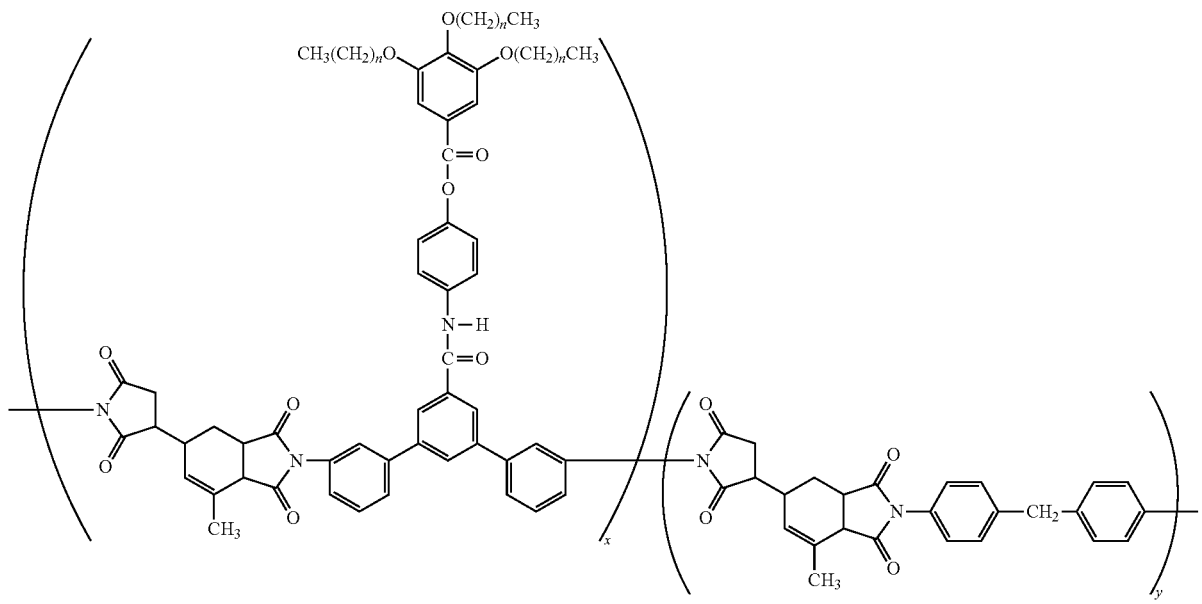

(1)

The polyimide NMP solution was applied using a spin coating method. The material was pre-baked in an oven at 100 Celsius degrees in nitrogen, and was post-baked for one hour in the oven at 180 Celsius degrees in nitrogen to form the second wettability variable layer 14 having a layer thickness of 650 nm (FIG. 2B). At this stage, the surface of the second wettability variable layer 14 was at low surface energy due to the polyimide having the hydrophobic side chain.

Figure 4:
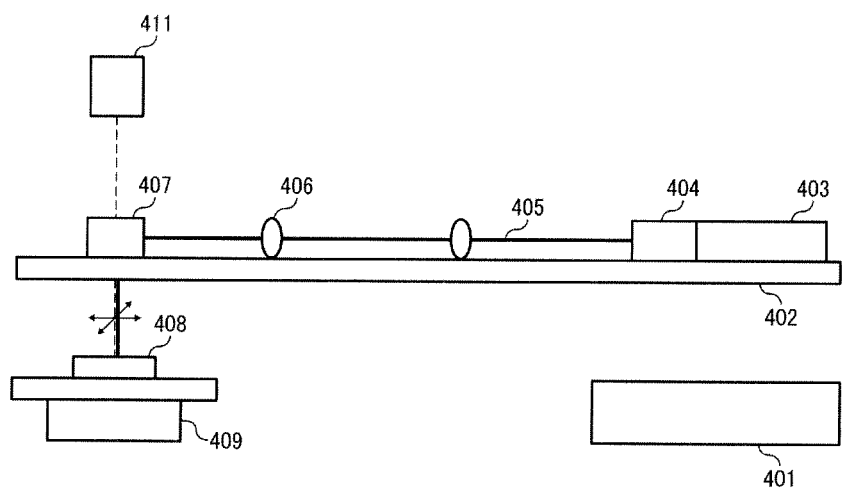
FIG. 4 is a schematic example configuration of a laser ablation apparatus.

Then, based on computer assisted design (CAD) data, a laser having a wavelength of ultraviolet range was irradiated to a portion corresponding to the second conductive layer 21 corresponding to a conductive portion such as wiring and electrode using a laser ablation apparatus illustrated in FIG. 4 (FIG. 2C), with which the concave portion 16 to be formed as a second conductive layer was formed, in which the concave portion 16 has a pattern as same as the wiring pattern of the second conductive layer 21 (FIG. 2D). At this stage, based on CAD data, an alignment mark of the first conductive layer 13 was read to align CAD data of the first conductive layer 13 and CAD data of the second conductive layer 21, and the position of alignment mark data of the second conductive layer 21 was adjusted with respect to the alignment mark of the first conductive layer 13. The surface of the concave portion 16 irradiated by the laser became the high surface energy area 14a, and an area not irradiated by the laser became the low surface energy area 14b due to the hydrophobic side chain of polyimide.

Figure 7:
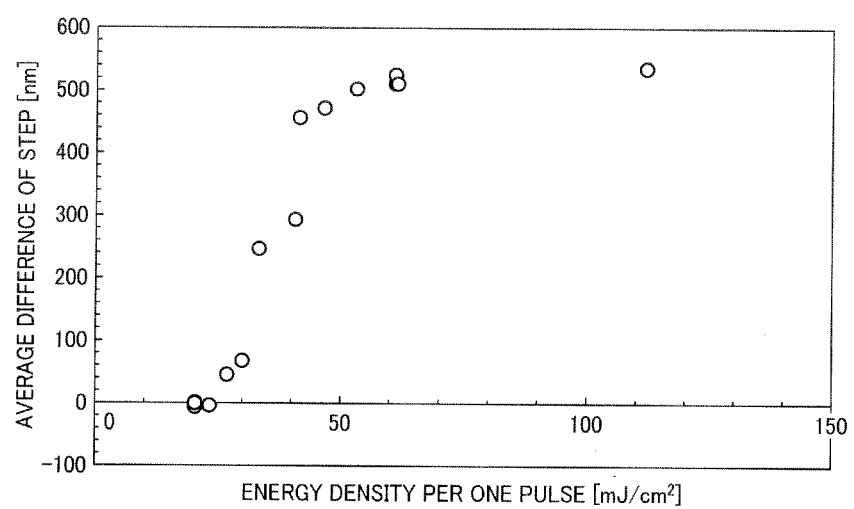
FIG. 7 is a graph of an evaluation result for a relationship between energy density of laser per one pulse, irradiated to a wettability variable layer by a laser ablation method, and an average difference of step (depth) of a concave portion.

A description is given of an evaluation result of a relationship between energy density of per one pulse laser, irradiated to a wettability variable layer, and an average difference of step (depth) of the concave portion 16 with reference to FIG. 7. In FIG. 7, the horizontal axis represents light energy density (m/cm²) per one pulse, and the vertical axis represents an average difference of step (nm) of the concave portion 16. The wettability variable layer was a polyimide layer formed on a glass plate. The laser scan speed was 240 mm/second. The polyimide layer was formed using polyimide NMP solution, which was prepared by mixing soluble polyimide material A having a dendrimer side chain shown as the above chemical formula (1) and polyimide (product name: CT4112, KYOCERA Chemical Corporation) having insulation performance higher than the soluble polyimide material A and not having a side chain. The polyimide NMP solution was applied on a glass plate. The material was pre-baked in an oven at 100 Celsius degrees in nitrogen, and was post-baked for one hour in the oven at 180 Celsius degrees in nitrogen to form the polyimide layer having a layer thickness of 500 nm. The evaluation was conducted using this polyimide layer.

As indicated by the result of FIG. 7, the average difference of step (depth) of the polyimide layer becomes deeper by increasing light energy density per one pulse. By further increasing light energy density per one pulse, a base (e.g., glass plate, film plate) under the polyimide layer can be processed. The processing depth is controlled to a suitable depth that can be recognized as the alignment mark and that can prevent sputtering of foreign substances. Further, without causing damage to the base under the polyimide layer, the polyimide layer having a layer thickness of 500 nm can be selectively removed. Specifically, the layer thickness of 500 nm of polyimide can be removed entirely or partially.

Then, based on CAD data, by using the laser ablation apparatus illustrated in FIG. 4, a laser of ultraviolet range was irradiated (FIG. 2D) to a portion where the via 22 is to be formed to form the via hole 18 to expose a partial portion of the first conductive layer 13 (FIG. 2E). The surface of the via hole 18 irradiated by the laser became the high energy area 14a as same as the surface of the concave portion 16, and an area not irradiated with the laser became the low surface energy area 14b due to the hydrophobic side chain of the polyimide. Because the alignment operation was conducted using the alignment pattern of the first conductive layer 13 when the concave portion 16 was formed in the previous step, another alignment operation is not required.

The formation sequence of the concave portion 16 and the via hole 18 can be changed, in which the via hole 18 is formed at first and then the concave portion 16 is formed. However, it is preferable to form the concave portion 16 at first and then to form the via hole 18 because the processing depth of the concave portion 16 in the wettability variable layer 14 becomes the same, and damage to the first conductive layer 13 at the lower part of the wettability variable layer 14 can be reduced. Because the process of forming the concave portion 16 and the process of forming the via hole 18 can be conducted without a special alignment operation, and the process of forming the concave portion 16 and the process of forming the via hole 18 are different only CAD data, the process of forming the concave portion 16 and the process of forming the via hole 18 can be combined in the same one process.

A description is given of the laser ablation apparatus used for laser irradiation with reference to FIG. 4. In Example 1, YAG laser was used as laser 403. The exited laser generates fourth harmonic wave at a laser head 404 and emits a laser beam 405 having a wavelength of 266 nm. Then, the laser beam 405 is controlled by an optical system 406 and Z-scanning by a XYZθ stage 409 to set a suitable beam diameter and a suitable beam shape such as top hat and Gaussian shape on a process face of a work 408.

An alignment mark on the work 408 is monitored by an alignment camera 411 while the XYZθ stage 409 is moved, and position information of the alignment mark is transmitted to a controller 401. The controller 401 processes the alignment mark position on the work 408 and image drawing pattern in CAD to control a galvano scanner 407, the XYZθ stage 409 and the laser 403, with which the concave portion 16 and the via hole 18 complied to CAD data can be formed.

When the XYZθ stage 409 and the galvano scanner 407 are combined as an optical system, a concave portion and a via hole can be formed on a wettability variable layer for a given drawing area by scanning the laser beam using the galvano scanner 407, in which image drawing can be conducted with energy smaller than moving a stage. Further, a circle, an elliptic, and a rectangular pattern can be drawn in addition to a straight line pattern in XY direction and slanted direction, with which more complex shape can be formed, and the freedom of design can be greater.

The laser ablation apparatus is not limited to an apparatus using the galvano scanner 407, but a combination of the XYZθ stage 409 and a reflection optical system can be used, which can be effective for drawing simple patterns of wiring such as in XY direction and a partially slanted direction. Further, a large area drawing can be conducted by enlarging the XYZθ stage 409.

By using the above described apparatus, the concave portion 16 having a width of 60, 40, 20, 10 µm and a depth of 150 nm were formed. The depth and width can be changed by adjusting laser output, scan speed, oscillating frequency, beam diameter, and focus position. In Example 1, for example, laser irradiation was conducted by setting the scan speed at 240 mm/seconds, and light energy density per one pulse at 35 mJ/cm$^2$ to form the concave portion 16.

The via hole 18 formed at the process of FIG. 2E had a hole diameter of 15 µm and a depth of 500 nm. The hole diameter can be changed by adjusting beam diameter and focus position, and the beam depth can be controlled by adjusting laser output, shot number, and oscillating frequency. In Example 1, for example, laser irradiation was conducted by setting 15 shots and the light energy density per one pulse at 50 mJ/cm$^2$ to form the concave portion 16.

The second wettability variable layer 14 used also as an insulation layer for wirings on or over the first conductive layer 13 was removed. Further, because the laser ablation method is used for processing, the concave portion 16 had a taper shape having a width of 0.5 µm in the horizontal direction of laser incidence face (an upper face in FIG. 2) and a height of 150 nm, in which an open part width of the concave portion 16 was slightly greater than a bottom of the concave portion 16. Further, the via hole 18 had a taper shape having a width of about 2 µm in the horizontal direction and a height of 500 nm.

Then, the conductive ink 19 (e.g., nano metal ink) such as Ag particles having a particle diameter of about 30 nm dispersed in aqueous solvent was selectively applied on the high surface energy area 14a of the concave portion 16 and the via hole 18 using an inkjet method (FIG. 2F). In Example 1, the conductive ink 19 was aqueous solution dispersed with fine metal particles. Therefore, the conductive ink 19 can be spread on and along the concave portion 16 and the via hole 18 formed by the laser ablation method, and fine patterns can be formed for any liquid droplet size used for the inkjet method. Because material use efficiency of the inkjet method application is greater and the number of process steps can be reduced compared to a spin coating and an etching, wiring can be formed at low cost by using the inkjet method application.

Upon applying the conductive ink 19, the material was pre-baked in an oven at 100 Celsius degrees in the atmosphere, and was post-baked for one hour in the oven at 180 Celsius degrees in the atmosphere, with which the second conductive layer 21 having a wiring width of 60, 40, 20, 10 µm and a layer thickness of 130 nm, and the via 22 having a via diameter of 15 µm and a depth of 500 nm were formed (FIG. 2G). No broken lines and no short of wiring were observed for any one of wiring width. Further, connection between the first conductive layer 13 and the second conductive layer 21 by the via 22 was confirmed. As to the wiring having the wiring width of 10 µm, the wiring overlaps the via diameter of 15 µm using 2.5 µm of wiring width at each side, in which a wiring width was partially 20 µm.

As above described, the second wettability variable layer 14, the second conductive layer 21 and the via 22 can be formed using printing methods such as a spin coating method and an inkjet method, with which fine wiring patterns be formed with lower cost. Further, the second wettability variable layer 14 can be removed by employing the laser ablation method using the fourth harmonic wave of YAG, and the conductive ink 19 can be applied using the inkjet method, with which an increase of the number of process steps can be suppressed, and function-enhanced wiring can be formed with fine wiring patterns and a fine wiring-to-wiring connection using a merit of the printing process which requires less processing steps. In the laser ablation method, a galvano scanner was used to scan laser beam, with which a mask is not required, and complex pattern can be processed at high speed at lower cost.

Example 2

In Example 2, a stacked-layer wiring illustrated in FIG. 3 was formed. As to the stacked-layer wiring of FIG. 3, different from Example 1, a concave portion corresponding to a wiring pattern was formed in the first wettability variable layer 12 by employing a direct pattern forming by laser, the first conductive layer 13 was formed by applying conductive ink using a nozzle printing method, and the conductive ink for forming the second conductive layer 21 and the via 22 was applied using the nozzle printing method. Other processes were same as Example 1.

At first, similar to Example 1, the thermoset polyimide NMP solution having the hydrophobic side chain was applied on the base 11 (e.g., glass plate), cleaned by wet cleaning, using a spin coating method to form the first wettability variable layer 12 having a layer thickness of 100 nm. At this stage, the surface of the first wettability variable layer 12 was at low surface energy due to the polyimide having the hydrophobic side chain.

Then, a concave portion corresponding to a wiring pattern of the first conductive layer 13 was formed by employing a laser ablation method using fourth harmonic wave of YAG laser (wavelength: 266 nm). Specifically, the laser irradiation was conducted to the wettability variable layer 12 using a scan speed of 240 mm/second, and light energy density per one pulse of 35 ml/cm$^2$ to form a concave portion having a width of 20 μm and a depth of 100 nm. An area of the wettability variable layer 12 on the base 11 (e.g., glass plate) corresponding to the concave portion was removed entirely, and the depth of the concave portion was set to a thickness (100 μm) of the applied layer.

An area not irradiated by the laser was formed as a low surface energy area due to the hydrophobic side chain of the polyimide. In Example 2, the concave portion was formed, and the surface energy can be changed with energy that does not cause laser ablation such as 20 to 30 ml/cm$^2$ as shown in FIG. 7. With this configuration, the first conductive layer 13 can be formed without using a mask.

Then, the conductive ink 19 (e.g., nano metal ink) such as Ag particles having a particle diameter of about 30 nm dispersed in aqueous solvent was applied to the formed concave portion using a nozzle printing method. Fine metal particles dispersed solution including relatively expensive fine particles of Ag can be selectively applied to a portion for forming a conductive layer when the nozzle printing method was used for the application. Therefore, compared to a forming operation using a spin coating method and an etching, material use efficiency can be higher, and further, an operation can be conducted with higher speed and a throughput can be higher, and wiring can be formed at low cost by using the nozzle printing method.

After applying the conductive ink 19, the material was pre-baked in an oven of 100 Celsius degrees in the atmosphere, and was post-baked for one hour in the oven of 180 Celsius degrees in the atmosphere, with which the first conductive layer 13 having a wiring width of 20 μm and a layer thickness of 100 nm was formed.

Then, the second wettability variable layer 14 was formed. The material of the second wettability variable layer 14 was polyimide NMP solution, which was prepared by mixing soluble polyimide material A having a dendrimer side chain illustrated in the above chemical formula (1) and polyimide (product name: CT4112, KYOCERA Chemical Corporation) having insulation performance higher than the soluble polyimide material A and not having a side chain. The polyimide NMP solution was applied using a spin coating method, and the material was pre-baked in an oven at 100 Celsius degrees in nitrogen, and was post-baked for one hour in the oven at 180 Celsius degrees in nitrogen to form the second wettability variable layer 14 having a layer thickness of 550 nm. At this stage, the surface of the second wettability variable layer 14 was at low surface energy due to the polyimide having the hydrophobic side chain.

Then, similar to Example 1, based on computer assisted design (CAD) data, fourth harmonic wave of YAG laser (wavelength: 266 nm) was irradiated to a portion corresponding to the second conductive layer 21 corresponding to a conductive portion such as wiring and electrode using the laser ablation apparatus illustrated in FIG. 4, with which the concave portion 16 to be formed as a second conductive layer was formed, in which the concave portion 16 had a pattern same as the wiring pattern of the second conductive layer 21. The laser irradiation was conducted by setting the scan speed at 240 nm/second and light energy per one pulse at 35 J/cm$^2$. The formed concave portion 16 had a width of 20 μm and a depth of 150 nm. The surface of the concave portion 16 irradiated by the laser became the high surface energy area 14a, and an area not irradiated by the laser became the low surface energy area 14b due to the hydrophobic side chain of polyimide.

Then, based on computer assisted design (CAD) data, fourth harmonic wave (wavelength: 266 nm) of YAG laser was irradiated to a portion corresponding to the via 22 using the laser ablation apparatus illustrated in FIG. 4, with which the via hole 18 was formed to expose a part of the first conductive layer 13. The laser irradiation was conducted by setting 15 shots and light energy per one pulse at 50 mJ/cm$^2$. The formed via hole 18 had a hole diameter of 15 μm and a depth of 400 nm. The surface of the via hole 18 irradiated by the laser became the high surface energy area 14a, and an area not irradiated by the laser became the low surface energy area 14b due to the hydrophobic side chain of polyimide.

Then, similar to the first conductive layer 13, the conductive ink 19 (e.g., nano metal ink) such as Ag particles having a particle diameter of about 30 nm dispersed in aqueous solvent was selectively applied on the high surface energy area 14a of the concave portion 16 and the via hole 18 using a nozzle printing method. After applying the conductive ink, the material was pre-baked in an oven of 100 Celsius degrees in the atmosphere, and was post-baked for one hour in the oven of 180 Celsius degrees in the atmosphere, with which the second conductive layer 21 having a wiring width of 20 μm and a layer thickness of 130 nm, and the via 22 having a hole diameter of 15 μm and a hole depth of 400 nm were formed.

As described above, the second wettability variable layer 14, the second conductive layer 21 and the via 22 can be formed using printing methods such as a spin coating method and a nozzle printing method, with which fine wiring can be formed at lower cost. Further, the second conductive layer 21 and the via 22 can be formed collectively in the same application process. Further, by conducting a continuous processing by the laser ablation, an alignment operation can be simplified, with which the number of process steps can be reduced. Further, because the first conductive layer 13, the second conductive layer 21 and the via 22 can be processed by the laser ablation method, complex patterns can be processed without a photo mask and can be processed at low cost and higher speed.

Example 3

In Example 3, an electronic element (e.g., thin film transistor) illustrated in FIG. 5 was formed. The thin film transistor illustrated in FIG. 5 includes the switching transistor 59, the driving transistor 58, and a storage capacitance. The thin film transistor is a driving element composed of two transistors and one capacitor (2T1C).

The thin film transistor includes a semiconductor layer 57, a substrate base 51 such as a film base, a first wettability variable layer 52, a wettability variable layer 54 used as an insulation layer or film, a first conductive layer 53 used as a gate electrode, a second conductive layer 55 used as a source electrode and a drain electrode, and a via 56 that electrically connects the first conductive layer 53 and the second conductive layer 55 as a stacked-layer wiring. The stacked-layer wiring can be formed using the forming method of stacked-layer wiring of Example 1.

A description is given of a manufacturing method of an electronic element. At first, as same as the process of Example 1, the first wettability variable layer 52 was formed with a layer thickness of 50 nm on the film base 51, cleaned by wet cleaning, using thermoset polyimide NMP solution having a hydrophobic group on a side chain.

Then, a photo mask having an opening pattern same as the gate electrode 53 (i.e., first conductive layer 53) was placed on the first wettability variable layer 52, and ultraviolet ray (emitted from a super high pressure mercury lamp) having a wavelength of 300 nm or less was irradiated to the first wettability variable layer 52 over the photo mask, in which ultraviolet ray irradiation level was 8 J/cm$^2$. With this irradiation, a pattern of the gate electrode 53 was formed on the first wettability variable layer 52 for each of the switching transistor 59 and the driving transistor 58, and a high surface energy area corresponding to a pattern of lower electrode of the storage capacitance was formed.

Then, the conductive ink 19 (e.g., nano metal ink) such as Ag particles having a particle diameter of about 30 nm dispersed in aqueous solvent was selectively applied on the high surface energy area, formed by the previous process using an inkjet method. Then, baking was conducted at 180 Celsius degrees to form the gate electrode 53 having an electrode width of 40 μm and a layer thickness of 100 nm, and the lower electrode of the storage capacitance.

Then, material (polyimide NMP solution) of the second wettability variable layer, the same one used in Example 1, was applied using a spin coating method, and then baking was conducted at 180 Celsius degrees to form the wettability variable layer 54 having a thickness of 650 nm. The wettability variable layer 54 is also used as a gate insulation layer.

Then, the laser ablation method was conducted using YAG laser of fourth harmonic wave (wavelength: 266 nm) to form the source/drain electrode 55 (i.e., the second conductive layer 55) for each of the switching transistor 59 and the driving transistor 58, and a concave portion having the same pattern of the upper layer electrode of the storage capacitance. At this stage, an alignment mark formed in the same layer of the gate electrode 53 so that the source/drain electrode 55 can be placed at a suitable position with respect to the gate electrode 53 for each of the transistors. The alignment mark was monitored using an alignment system of the laser ablation apparatus, and the laser ablation processing was conducted to align the alignment mark and alignment data in the same data of the source/drain electrode 55.

To set a channel width of the electronic element to 5 μm, an interval for concave portions corresponding to the source/drain electrode 55 was set 5 μm, and a depth of concave portion was set 150 nm, in which laser irradiation was conducted using a scan speed of 240 mm/sec and light energy per one pulse of 35 mJ/cm$^2$.

Then, as same as the previous process, the laser ablation method was conducted using YAG laser of fourth harmonic wave (wavelength: 266 nm) to form a via hole for the via 56 that electrically connects the source electrode 55 and the gate electrode 53 for the switching transistor 59 and the driving transistor 58, in which the formed via hole had a hole diameter of 15 μm and a depth of 500 nm. The hole diameter can be changed by adjusting the beam diameter and focus position, and the beam depth can be controlled by adjusting laser output, shot number, and oscillating frequency. In Example 2, the laser irradiation was conducted by setting 15 shots and the light energy density per one pulse at 50 mJ/cm$^2$.

At an area for forming the via hole, the second wettability variable layer 54 used also as the insulation layer for wirings on or over the gate electrode 53 was removed. When the via hole was formed, the laser ablation apparatus used for forming a concave portion having the same pattern of the source/drain electrode 55 was used, and the substrate base was processed continuously without removing from the apparatus, with which an alignment operation can be omitted.

Then, the conductive ink used for Example 1 was selectively applied to a high surface energy area of the concave portion and the via hole using an inkjet method. Then, under the same condition of Example 1, the material was pre-baked and post-baked to form the source/drain electrode 55 having a layer thickness of 130 nm, and the via 56 having a hole diameter of 15 μm and a depth of 500 nm simultaneously.

Then, an application liquid having solved triarylamine (organic semiconductor material), shown as the following chemical formula (2), in xylene/mesitylene-mixed solvent was dropped to the channel by using an inkjet method, and then dried at 120 Celsius degrees.

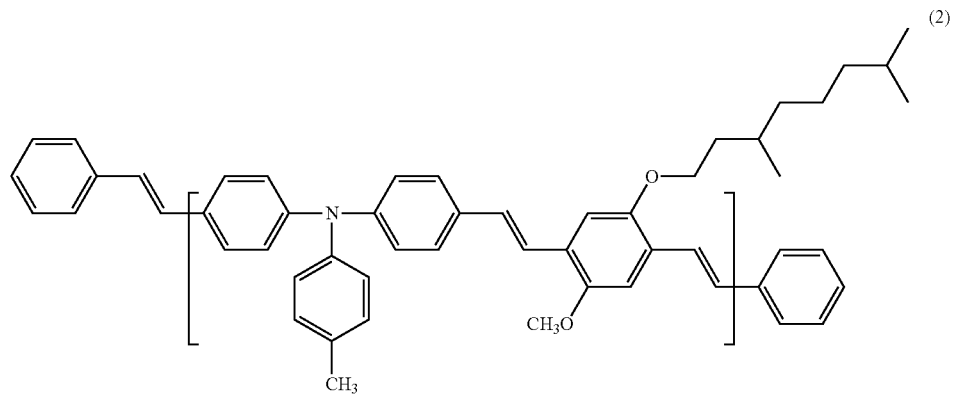

(2)

With this process, an organic semiconductor layer 57 having a layer thickness of 30 nm was formed to obtain an organic transistor.

The second wettability variable layer 54 can function as a gate insulation layer. Further, because the channel portion between the source/drain electrode 55 is a low surface energy area, absorbency of water or the like is little, with which an interface preferable for property of the thin film transistor can be provided. Further, because the source/drain electrode 55 and the gate insulation layer 54 can be formed on the substantially same plane, print control when forming the semiconductor layer 57 can become easier, and an electrical connection to the source/drain electrode 55 becomes easier.

The property of the thin film transistor prepared for Example 3 was evaluated. The patterning of the source/drain electrode 55 and the gate electrode 53 was evaluated good. The ON/OFF ratio became five digits, and electron field—effect mobility was $6\times10^{-3}$ cm$^2$/Vs. Further, operation of the switching transistor 59 and the driving transistor 58 were confirmed, and it was confirmed that two transistors were operated via the via 56 effectively.

As described above, as to the manufacturing method of the electronic element of Example 3, the wettability variable layer 54 having a function of a gate insulation layer and the source/drain electrode 55 can be formed using printing methods such as a spin coating method and an inkjet method, with which a fine electronic element can be formed at lower cost. Further, the source electrode 55 and the gate electrode 53 for the switching transistor 59 and the driving transistor 58 can be electrically connected by the via 56 formed by the laser ablation method and the inkjet printing method, with which function enhanced electronic element can be formed.

Example 4

In Example 4, an electronic element (e.g., thin film transistor) illustrated in FIG. 6 was formed. The thin film transistor illustrated in FIG. 6 includes the switching transistor 69, the driving transistor 68, and a storage capacitance. The thin film transistor is a driving element composed of two transistors and one capacitor (2T1C).

The thin film transistor includes a semiconductor layer 67, a substrate base 61, a first wettability variable layer 62, a second wettability variable layer 64 used as an insulation layer or film, a first conductive layer 63 used as a gate electrode, a second conductive layer 65 used as a source electrode and a drain electrode, and a via 66 that electrically connects the first conductive layer 63 and the second conductive layer 65 as a stacked-layer wiring. The stacked-layer wiring can be formed using the method of forming stacked-layer wiring of Example 2.

Similar to Example 2, the gate electrode 63 (i.e., first conductive layer 63) was formed for the thin film transistor illustrated in FIG. 6 using the laser ablation method, in which the first wettability variable layer 62, formed before forming the second wettability variable layer 64 by an application method, was substantially flat without unevenness as illustrated in FIG. 6, and an electronic element having enhanced insulation performance can be obtained.

In the above described example embodiment and Examples, the laser ablation method using laser having a wavelength of ultraviolet range is conducted to form a concave portion and a via hole for forming a conductive layer in a wettability variable layer, and wettability of the concave portion and the via hole can be changed by laser irradiation, with which the conductive ink can be disposed only to a targeted concave portion and via hole when applying the conductive ink. Further, formation of the concave portion and change of wettability can be conducted in the same process, and formation of the via hole and change of wettability can be conducted in the same process, and further, the concave portion and the via hole can be formed using the same laser machine by changing data alone. Therefore, an increase of the number of process steps and equipment specifications can be suppressed while using a smaller number of process steps using a printing method. Therefore, fine and enhanced insulation performance wirings can be formed using a merit of a printing method using a smaller number of process steps. Further, by combining an inkjet method that can omit a mask plate and a direct pattern forming method using laser that can omit a mask plate, a new wiring process combining a maskless printing and an optical process can be provided.

As to the above described example embodiment and Examples for the method of forming stacked-layer wiring, enhanced fine conductive patterns can be formed using a printing having a smaller number of process steps, and the above described method of forming stacked-layer wiring can be used to form a multi-layered wiring and fine wiring-to-wiring connection.

Numerous additional modifications and variations are possible in light of the above teachings. It is therefore to be understood that, within the scope of the appended claims, the disclosure of the present invention may be practiced otherwise than as specifically described herein. For example, elements and/or features of different examples and illustrative embodiments may be combined each other and/or substituted for each other within the scope of this disclosure and appended claims.

What is claimed is:

1. A method of forming a stacked-layer wiring comprising:
   forming a first wettability variable layer on a substrate using material that changes surface energy by energy application;
   forming a first conductive layer in the first wettability variable layer or on the first wettability variable layer;
   forming a second wettability variable layer on the first wettability variable layer formed with the first conductive layer using material that changes surface energy by energy application;
   forming a concave portion to become a wiring pattern of a second conductive layer to the second wettability variable layer by employing a laser ablation method using a laser having a wavelength of ultraviolet range while concurrently forming a first high surface energy area on a surface of the second wettability variable layer exposed by forming the concave portion by changing surface energy;
   forming a via hole by exposing a part of the first conductive layer by employing the laser ablation method using the laser having the wavelength of ultraviolet range while concurrently forming a second high surface energy area on a surface of the second wettability variable layer exposed by forming the via hole by changing surface energy; and
   applying conductive ink to the first and second high surface energy areas to form the second conductive layer and a via simultaneously.

2. The method of forming the stacked-layer wiring of claim 1, wherein forming the first conductive layer includes: forming a third high surface energy area by irradiating laser having the wavelength of ultraviolet range to the first wettability variable layer, and applying the conductive ink on the third high surface energy area.

3. The method of forming the stacked-layer wiring of claim 1, wherein forming the first conductive layer includes: forming a concave portion to become a wiring pattern of the first conductive layer to the first wettability variable layer by employing the laser ablation method using the laser having the wavelength of ultraviolet range while concurrently forming the third high surface energy area on the surface of the first wettability variable layer by changing surface energy of the surface of the first wettability variable layer, exposed by forming the concave portion, and applying a conductive ink on the third high surface energy area.

4. The method of forming the stacked-layer wiring of claim 1, wherein the laser having the wavelength of ultraviolet range is one of third harmonic wave of yttrium aluminum garnet (YAG) laser, fourth harmonic wave of YAG laser, and an excimer laser.

5. The method of forming the stacked-layer wiring of claim 1, wherein at least one of the concave portion to become the wiring pattern of the second conductive layer and the via hole is formed by scanning a laser beam using a galvano scanner.

6. The method of forming the stacked-layer wiring of claim 1, wherein the applying of the conductive ink is one of an inkjet method and a nozzle printing method.

7. The method of forming the stacked-layer wiring of claim 1, wherein the material that changes surface energy by energy application is composed of a main chain made of material including polyimide, and a side chain formable as a hydrophilic group by ultraviolet ray irradiation.

* * * * *